United States Patent
Egerer

(10) Patent No.: US 7,495,971 B2
(45) Date of Patent: Feb. 24, 2009

(54) CIRCUIT AND A METHOD OF DETERMINING THE RESISTIVE STATE OF A RESISTIVE MEMORY CELL

(75) Inventor: Jens Christoph Egerer, Kirchheim (DE)

(73) Assignee: Infineon Technologies AG, Munich (DE)

( * ) Notice: Subject to any disclaimer, the term of this patent is extended or adjusted under 35 U.S.C. 154(b) by 288 days.

(21) Appl. No.: 11/406,803

(22) Filed: Apr. 19, 2006

(65) Prior Publication Data

US 2007/0247892 A1 Oct. 25, 2007

(51) Int. Cl.
G11C 5/14 (2006.01)

(52) U.S. Cl. .......................... 365/189.09; 365/189.07; 365/148; 365/185.21

(58) Field of Classification Search ............ 365/189.09, 365/189.07, 148, 185.21
See application file for complete search history.

(56) References Cited

U.S. PATENT DOCUMENTS

| | | | | |
|---|---|---|---|---|
| 5,432,746 | A | * | 7/1995 | Guedj ........................ 365/202 |
| 6,219,290 | B1 | * | 4/2001 | Chang et al. ................. 365/207 |
| 6,501,697 | B1 | | 12/2002 | Perner et al. |
| 6,597,598 | B1 | | 7/2003 | Tran et al. |
| 6,621,729 | B1 | | 9/2003 | Garni et al. |
| 6,762,953 | B2 | | 7/2004 | Tanizaki et al. |
| 2004/0095825 | A1 | | 5/2004 | Tanizaki et al. |
| 2004/0120200 | A1 | | 6/2004 | Gogl et al. |
| 2005/0078531 | A1 | | 4/2005 | Lammers |
| 2005/0157546 | A1 | | 7/2005 | Lammers et al. |
| 2005/0243596 | A1 | | 11/2005 | Symanczyk |
| 2006/0050546 | A1 | | 3/2006 | Roehr |

FOREIGN PATENT DOCUMENTS

EP  1847999  5/2008

OTHER PUBLICATIONS

Kozicki, M.N., et al., "Non-Vollatile Memory Based on Solid Electrolytes," Center for Solid State Electronics Research, Arizona State University, 2004, 8 pages.

* cited by examiner

Primary Examiner—Tuan T. Nguyen
(74) Attorney, Agent, or Firm—Dicke, Billig, Czaja, PLLC

(57) ABSTRACT

A method and a circuit are disclosed for determining the resistive state of a resistive memory cell being read. The method includes determining the resistive state of the memory cell being read by comparing a current dependent on the resistive state of the memory cell being read with a reference current that can be dependent on a resistive state of at least one reference resistive memory cell. A read circuit can be constructed to compare the two currents. The resistive state of the memory cell being read is indicative of the data bit stored by the memory cell.

8 Claims, 5 Drawing Sheets

CIRCUIT AND A METHOD OF DETERMINING THE RESISTIVE STATE OF A RESISTIVE MEMORY CELL

TECHNICAL FIELD

The invention relates to a circuit and a method of determining the resistive state of a resistive memory cell.

BACKGROUND

It is conventional to determine the resistive state of a resistive memory cell, and thus the data bit stored in the resistive memory cell, by using an operational amplifier to compare a voltage dependent on the resistive state of the memory cell with a reference voltage obtained from a reference resistive memory cell. A reference memory cell is used to provide the reference voltage since it will be subjected to the same temperature and voltage influences as the cell being read and it will typically be affected by manufacturing tolerances in a manner similar to the cell being read.

A resistive memory cell has a resistance that can be programmed to have either a high resistance value or a low resistance value when accessed. One example of a conventional resistive memory cell is a PMC (programmable metallization cell), which utilizes electrochemical control of nanoscale quantities of a metal in thin films of solid electrolyte. A PMC can have a low resistance value of, for example, $10^4$ ohms and a high resistance value of, for example, $10^9$ ohms. The low resistance value can represent a data bit having a logic 1 value and the high resistance value can represent a data bit having a logic 0 value (or vice-versa). Another example of a conventional resistive memory cell is a phase change memory cell, which has a high resistance value in an amorphous state and a low resistance vale in a crystalline state. A heater element is used to heat a programmable volume of the phase change memory cell and to place the programmable volume into the amorphous state or the crystalline state.

SUMMARY OF THE INVENTION

A method and a circuit are disclosed for determining the resistive state of a resistive memory cell being read. The method and operation of the circuit are based on determining the resistive state of the memory cell by comparing a current dependent on the resistive state of the memory cell with a reference current.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

In the following description, PMCs (programmable metallization cells) are mentioned as merely one example of resistive memory cells that can be used when implementing the invention. The invention, however, should not be construed as being limited to being used with PMCs. Phase change memory cells, for example, as well as other types of memory cells having a programmable resistance could also be used.

When a PMC is being read, the voltage across the resistance of the memory cell is typically held in the range from 100 mV to 200 mV. In the case where a PMC being read has a low resistance state with a low resistance value of, for example $10^4$ ohms, a typical current flowing through the memory resistance will be 10 uA. In the case where the PMC has a high resistance state with a high resistance value of, for example $10^9$ ohms, a typical current flowing through the memory resistance will be 100 pA. In the following description, the low resistance state is assigned to represent a data bit having a logic 1 value and the high resistance state is assigned to represent a data bit having a logic 0 value, although the opposite assignment could alternatively be made.

The invention is based on reading the content of a resistive memory cell by comparing the current flowing through the resistive memory cell being read with a reference current that is, e.g., dependent on the current flowing through one or more reference resistive memory cells.

Figure 1:
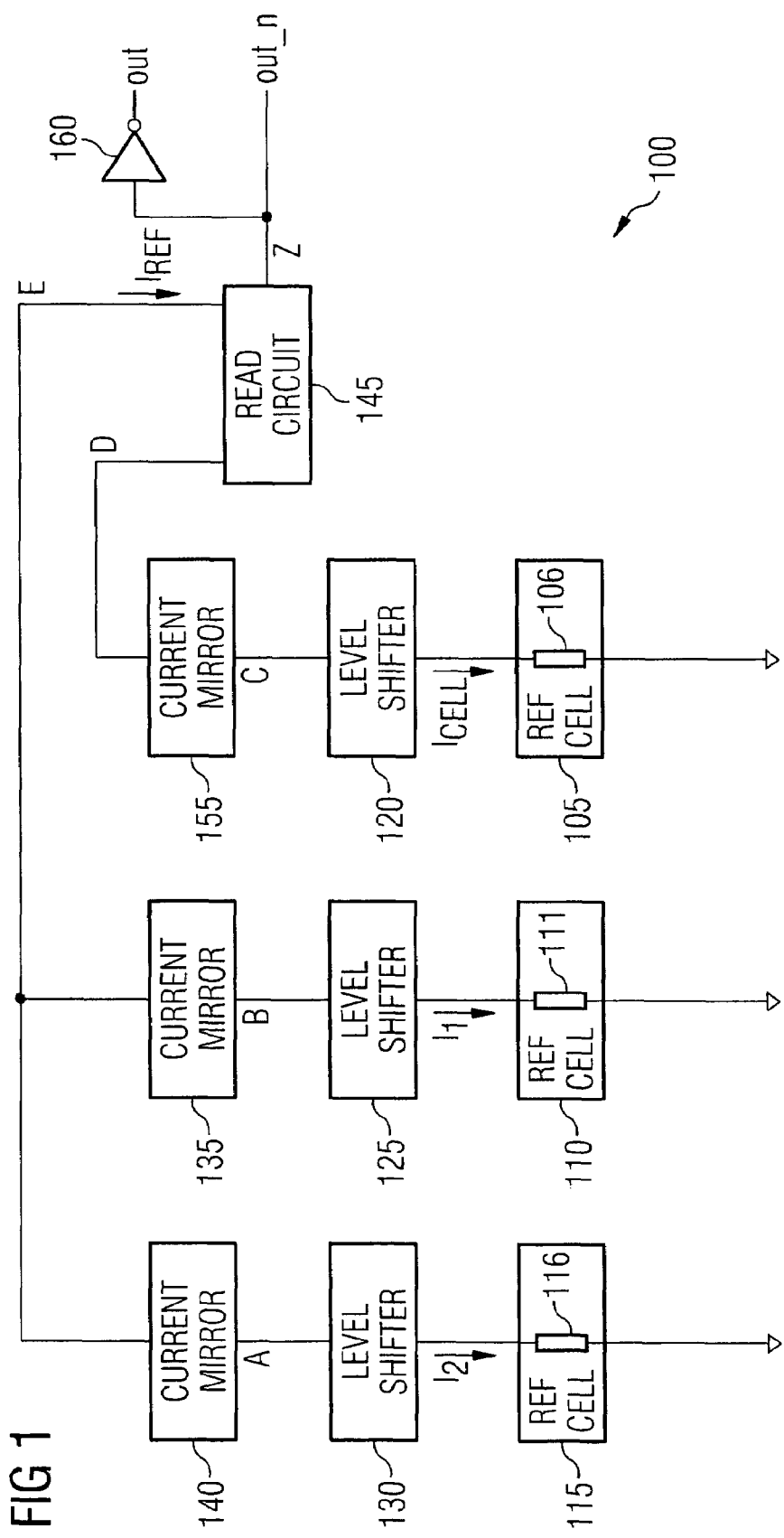
FIG. 1 is a basic block diagram of a circuit for determining the resistive state of a resistive memory cell.

FIG. 1 is a basic block diagram of a circuit 100 for determining the resistive state of the resistive memory cell 105. The stored data bit is a logic 1 or logic 0, depending on the resistive state of the resistance 106 of the memory cell 105. For example, if it is determined that the resistance 106 is in the low resistive state, the resistive memory cell 105 is storing a logic 1. Comparing means, in this example a read circuit 145, is provided for comparing the current in branch D with the current in branch E in order to determine the resistive state of the memory cell 105 and thus, the data bit stored therein. The current in branch D is dependent on the current $I_{cell}$ flowing through the memory cell 105 and is thus dependent on the value of the resistance 106 of the memory cell 105. The current in branch E is a reference current $I_{ref}$. One or more reference resistive memory cells 110, 115 serve as a means for providing a reference current $I_{ref}$. The reference resistive memory cells 110, 115 will be subjected to the same temperature, voltage, and current influences as the memory cell 105 being read and will typically be affected by manufacturing tolerances in a manner similar to the memory cell 105 being read.

The reference current $I_{ref}$ may be dependent on the current flowing through the resistance of only one reference resistive memory cell. For example, the reference current $I_{ref}$ may be dependent on the current $I_1$ flowing through the resistance 111 of the reference resistive memory cell 110. In this case, the reference resistive memory cell 110 is, for example, set to have a low resistance value.

When the high and low resistive states of the resistive memory cells used in a particular technology or implementation have resistance values that are not too far apart, the current flowing through the memory cell in the low resistive state will not differ by a great amount from the current flowing through the memory cell in the high resistive state. In this case, it is advantageous to obtain the reference current $I_{ref}$ by using two reference resistive memory cells 110, 115. The reference current $I_{ref}$ will then be dependent on the current $I_1$ flowing through the reference resistive memory cell 110 and will also be dependent on the current $I_2$ flowing through the reference resistive memory cell 115. The reference resistive memory cell 115 is set to have the high resistance state, which in this example, has been assigned the logic value 0. The reference current $I_{ref}$ is, for example, simply equal to the sum of the currents flowing through both reference resistive memory cells 110 and 115, however, this sum could be multiplied by a suitable factor in some cases. In fact, the current flowing through either one or both of the reference resistive memory cells 110, 115 could be multiplied by a suitable factor. The important aspect is simply to obtain a reference current $I_{ref}$ that can be compared with a current dependent on the current $I_{cell}$ flowing through the memory cell 105 so that the resistive state of the memory cell 105 and thus the data bit being stored in the memory cell 105 can be reliably determined.

The read circuit 145 provides an output signal, out_n, depending on the relationship between the magnitude of the current in branch D and the magnitude of the current in branch E, which is the reference current $I_{ref}$. If read circuit 145 finds that the current in branch D is higher than the reference current $I_{ref}$, then the output signal out_n indicates that the memory cell 105 has a low resistance state and is storing a data bit having a logic 1 value. If, however, the read circuit 145 finds that the current in branch D is lower than the reference current $I_{ref}$, then the output signal out_n indicates that the memory cell 105 has a high resistance state and is storing a data bit having a logic 0 value. It should be clear that the read circuit 145 basically functions as a current comparator and one of ordinary skill in the art should now be enabled to construct the read circuit 145 in a number of different ways. Four particular examples of constructing the read circuit 145 will be provided later on in this text. The invention, however, should not be construed as being limited to these examples.

A current mirror 155 may be used to mirror the current $I_{cell}$ flowing through the resistance 106 of the memory cell 105 into branch D of the read circuit 145. Thus, the current mirror 155 serves as a means for feeding the current $I_{cell}$ to the read circuit 145. Similarly, a current mirror 135 may be used to mirror the current $I_1$ flowing through the resistance 111 of the reference resistive memory cell 110 into another branch E of the read circuit 145. Thus, the current mirror 135 serves as a means for feeding the current $I_1$ to the read circuit 145. When the second reference resistive memory cell 115 is optionally provided, a current mirror 140 may be provided to mirror the current $I_2$ flowing through the resistance 116 of the second reference resistive memory cell 115 into the branch E of the read circuit 145 so that the reference current $I_{ref}$ in branch E will be the sum of the currents from current mirror 135 and current mirror 140. The current mirror 140 will then serve as a means for feeding the current $I_2$ to the read circuit 145. The mirror ratios of current mirror 155, current mirror 135, and current mirror 140 should be chosen to cooperate in a way enabling the read circuit 145 to clearly make a determination as to whether the current in branch D or the reference current $I_{ref}$ in branch E is greater. In this manner the data bit being stored in the memory cell 105 can clearly be determined.

Depending on the particular resistive memory cells being used, level shifters may need to be provided. For example, when PMCs are being used, the voltage across the resistance of a PMC will typically need to be limited to be in the range from 100 mV to 200 mV. Level shifting means, specifically, the level shifters 120, 125, and 130 have been provided for this purpose. By shifting the voltage between each resistive memory cell 105, 110, and 115 and the respective current mirror 155, 135, and 140, the voltage across the resistance 106, 111, and 116 of each resistive memory cell 105, 110, and 115 can be limited to the desired value. The level shifters 120, 125, and 130 can be designed to include select transistors to access the resistive memory cells 105, 110, and 115. A level shifter design including select transistors can be similar to the conventional design used in a DRAM (Dynamic Random Access Memory). The gate of a select transistor can be connected to a wordline and the drain of the select transistor can be connected to the bitline.

Optionally it is also possible to add constant currents to the currents flowing through the reference resistive memory cells 110, 115 and through the memory cell 105 to be read. For example, constant currents could be added to flow through the current mirrors 135, 155 in the branches B and C to ground and in one option also through the current mirror 140 in branch A to ground in order to increase the currents in the current mirrors (135, 155 and possibly 140) and in the read circuit 145. Theoretically this would speed up the evaluation in the read circuit 145. When adding such constant currents however, there is the risk that the evaluated currents through branches D and E will differ only slightly and thus the evaluation required for a secure decision between zero and one will become longer. Such constant additional currents could also be added at other locations, for example, directly into the branches D and E of the read circuit 145.

An inverter 160 can be provided to drive a higher capacitive load. In some cases where necessary because of a particular implementation of the read circuit 145, the inverter 160 can pull the output (out) to the full logic levels of the chip.

Four particular embodiments 145A, 145B, 145C, and 145D of the read circuit 145 will be provided below. These embodiments are provided merely as examples and the invention should not be construed as being necessarily limited to using these particular embodiments. Similar circuit components will be designated using the same reference symbols in all of the embodiments.

These read circuits 145A, 145B, 145C, and 145D can be realized with a small number of transistors so that the circuit layout can be put on a relatively small and narrow grid. Thus, a memory chip can include a number of read circuits 145A, 145B, 145C, or 145D sufficient to enable a large number of cells to be read in parallel and to enable the amplified signals to be switched onto a data bus. Similar to the read amplifiers configured in a conventional DRAM, for example, one read circuit 145A, 145B, 145C, or 145D can be provided in the layout for every four bitlines. Each of the read circuits 145A, 145B, 145C, and 145D use a relatively small area on the chip when compared to that required for implementing conventional operational amplifiers. The read circuits 145A, 145B, 145C, and 145D can be implemented quite simply and large transistors are not required for reducing voltage offset errors as is required when using a conventional operational amplifier, for example, to read a data bit from a resistive memory cell. The full logic level of the chip or very close to that level is obtained at the output of each read circuit 145A, 145B, 145C, and 145D and an additional level shifter is not required for this purpose.

Figure 2:
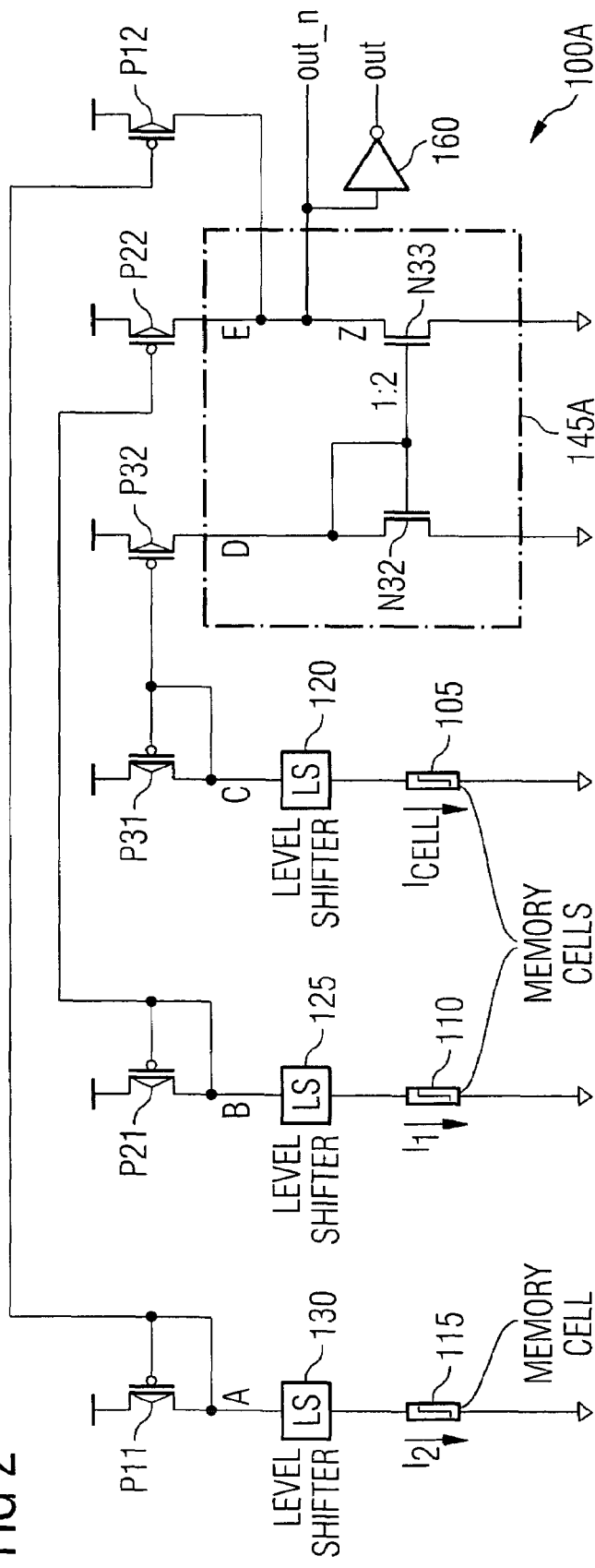
FIG. 2 is a schematic diagram of a circuit implementing a first embodiment of a read circuit.

FIG. 2 is a schematic diagram of a circuit 100A for determining the resistive state of the resistive memory cell 105. The circuit 100A implements a first exemplary embodiment of a read circuit 145A for reading the resistive memory cell 105. The read circuit 145A is constructed as a current mirror using NFETs N32 and N33 and is indicated using dashed lines.

The current $I_1$ flowing through the reference cell 110 is mirrored into branch E of the read circuit 145A by the current mirror formed by PFETs P21 and P22. Optionally, the current $I_2$ flowing through the reference cell 115 is additively mirrored into branch E of the read circuit 145A by the current mirror formed by PFETs P11 and P12. The current $I_{cell}$ flowing through the resistive memory cell 105 is mirrored into branch D of the read circuit 145A by the current mirror formed by PFETs P31 and P32. In this embodiment, the current mirror formed by PFETs P31 and P32 has a mirror ratio of 1:1. The read circuit 145A then mirrors the current $I_{cell}$ from branch D into the output branch E using a mirror ratio of 1:2.

The PFETs P32 and P22 work against the NFETs N32 and N33 of the read circuit 145A so that, when only one reference cell 110 is used, node Z of the read circuit 145A will be pulled to the voltage assigned to logic 0 or to the voltage assigned to logic 1 depending on whether twice the current $I_{cell}$ flowing through the resistive memory cell 105 is larger than the current $I_1$ flowing through the reference cell 110. In the case when two reference cells are used, node Z of the read circuit 145A will be pulled to the voltage assigned to logic 0 or logic 1 depending on whether twice the current $I_{cell}$ flowing through the resistive memory cell 105 is larger than the sum of the currents $I_1$ and $I_2$ flowing through the reference cells 110 and 115, respectively.

Other combinations of mirror ratios are possible. The mirror consisting of P31 and P32 and the mirror formed by N32 and N33 for example cooperate to provide at least 1.5 times, for example 2 times, the amplification factor provided by the current mirror P21 and P22 (and possibly 2 times that of P11 and P12 as well).

The maximum current flowing through branch E is determined by the smaller current provided to the read circuit 145A. In the case when a logic 1 is stored in the resistive memory cell 105, the current mirrored to N33 from N32, which is 20 uA when a PMC is used, is limited by the reference current of 10 uA. In the case when a logic 0 is stored in the resistive memory cell 105, the current mirrored to N33 from N32, which is approximately 200 pA when a PMC is used, limits the current flowing through branch E to approximately 200 pA.

The inverter 160 may be provided to drive a higher capacitive load and can pull the output (out) to the full logic levels of the chip, while providing minimal leakage current. It may be advantageous to speed up the switching time by precharging node Z to a potential lying in the middle between those assigned to logic 0 and logic 1, however in this case switches may be required as a measure against high leakage currents. One or more non-illustrated switching transistors can be used to switch the current mirror formed by N32 and N33 on and off.

Figure 3:
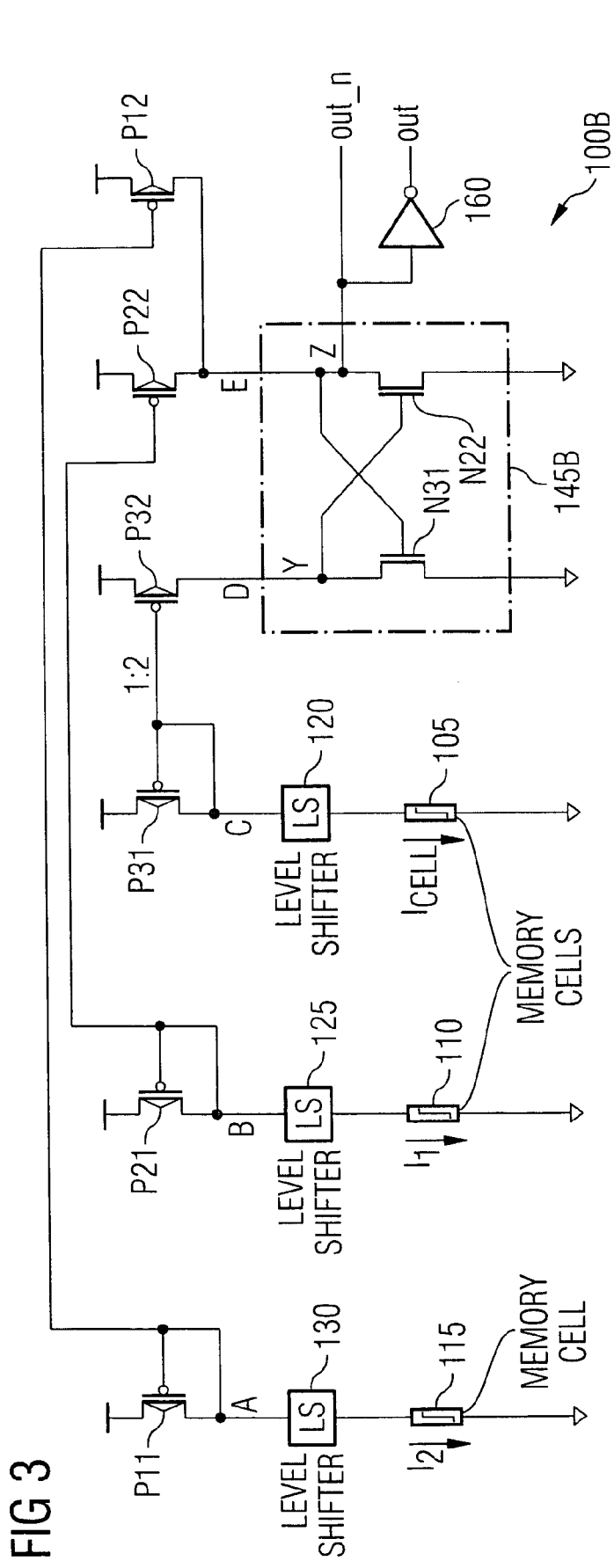
FIG. 3 is a schematic diagram of a circuit implementing a second embodiment of a read circuit.

FIG. 3 is a schematic diagram of a circuit 100B for determining the resistive state of the resistive memory cell 105. The circuit 100B implements a second exemplary embodiment of a read circuit 145B for reading the resistive memory cell 105. The read circuit 145B includes NFETs N31 and N22 that are cross-coupled similar to the way that such transistors are connected in level shifters.

Depending on whether the current in branch D or the current in branch E is larger, one of the nodes Y and Z will be pulled to the voltage assigned to logic 1. The cross coupling of NFETs N31 and N22 will cause the other one of the nodes Y and Z to be simultaneously pulled to the voltage assigned to logic 0. The amplification is thereby increased since the NFET in the branch charged to the logic 1 voltage is switched off. The current is also reduced since current can flow in only one branch D or E. The mirror ratio of the current mirror formed by P31 and P32 has been set to 1:2. Other mirror ratios could be used, for example, 1:1.5. Alternatively, the mirror ratios of all the current mirrors could be adjusted to suitable values just as long as the read circuit 145B can distinguish the current mirrored into branch D from the reference current in branch E.

One or more non-illustrated transistors may be provided for switching on the read circuit 145B for reading the memory cell 105. It may also be advantageous to precharge the nodes Y and Z to the logic 0 voltage, the logic 1 voltage, or to a level between the logic 0 and logic 1 voltages to speed up the switching time of the circuit 145B. In this case, however, it may be necessary to provide switches to protect against high leakage currents when the circuit 100B is switched off. In addition, leakage currents could be prevented by using one or more suitable transistors to switch off NFETs N31 and N22.

Figure 4:
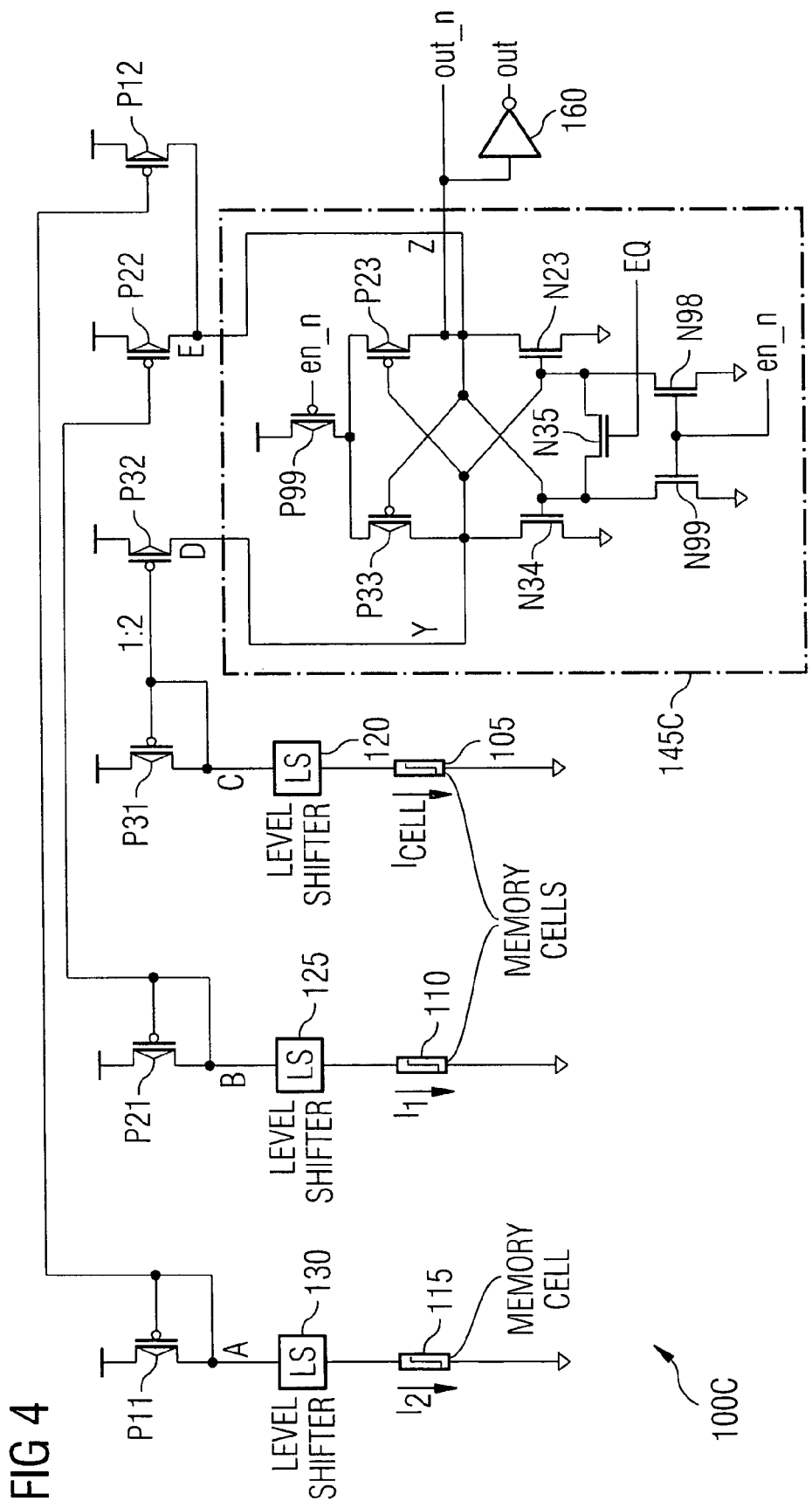
FIG. 4 is a schematic diagram of a circuit implementing a third embodiment of a read circuit.

FIG. 4 is a schematic diagram of a circuit 100C for determining the resistive state of the resistive memory cell 105. The circuit 100C implements a third exemplary embodiment of a read circuit 145C for reading the resistive memory cell 105. The read circuit 145C is based on a sense amplifier—clocked latch—that is used in a DRAM (dynamic random access memory). The full voltage level of the memory chip is obtained at node Z and, therefore, level shifters need not be provided for this purpose. The cross-coupling of the inverters, formed by P33, N34 and P23, N23, enable high amplification and speed. The read circuit 145C enables small transistors to be used when compared to implementations using operation amplifiers since large transistors are not required for reducing voltage offset errors.

The current mirror formed by PFET P31 and PFET P32 mirrors the current $I_{cell}$ flowing through the resistive memory cell 105 into branch D of the read circuit 145C. This current mirror for example has a mirror ratio acting to increase the mirrored current into branch D. In the exemplary embodiment the mirror ratio has been set to 1:2. The mirror ratio may be higher, for example 1:3, or lower, for example 1:1.5, just as long as it enables the read circuit 145C to distinguish between the mirrored current from the resistive memory cell 105 and the mirrored current from the reference cell 110 or cells 110 and 115. It is also possible to enable the read circuit 145C to distinguish between the mirrored currents by setting the mirror ratio of the current mirror formed by P21 and P22 and possibly also the current mirror formed by P11 and P12 to decrease the value of the mirrored current or currents with respect to the current flowing through the reference cells.

The reference resistive memory cell 110 stores a logic 1, which corresponds to a resistance value of about $10^4$ ohms when PMCs are being read. The current through the reference resistive memory cell 110 will then lie in the range of approximately 10 uA.

The level shifters 120, 125, and 130 can be designed to include select transistors to access the memory cells 105, 110, and 115 in a manner similar to the design used in a DRAM. The gate of a select transistor can be connected to a wordline and the drain of the select transistor can be connected to the bitline.

When one reference cell 110 is used to provide a reference current, node Z of the read circuit 145C will be pulled to the voltage assigned to logic 0 or logic 1 depending on whether twice the current $I_{cell}$ flowing through the resistive memory cell 105 is larger than the current $I_1$ flowing through the reference cell 110. When two reference cells 110, 115 are used, node Z of the read circuit 145C will be pulled to the voltage assigned to logic 0 or logic 1 depending on whether twice the current $I_{cell}$ flowing through the resistive memory cell 105 is larger than the sum of the current $I_1$ flowing through the reference cell 110 and the current $I_2$ flowing through the reference cell 115.

Transistor P99 and the input signal en_n are used to switch the read circuit 145C on and off. When the read circuit 145C is switched off, transistors N98 and N99 can be used to place each of the nodes Y and Z at a defined voltage value so that when the read circuit 145C is switched on, the read circuit 145C starts from the defined voltage value. The defined voltage value can be, for example, zero volts or a voltage halfway between the voltages assigned to logic 0 and logic 1. The signal EQ and the NFET N35 can be used to equalize nodes Y and Z.

The output signal out_n at node Z is pulled to the voltage assigned to logic 0 or logic 1 depending on whether twice the current $I_{cell}$ of the resistive memory cell 105 is smaller or larger than the reference current $I_{ref}$, which is obtained from reference memory cell 110 or reference memory cells 110 and 115. The cross-coupling of transistors P33 and N34 with transistors P23 and N23, respectively, simultaneously cause the respective other node Z or Y to be pulled to zero more strongly. This increases the amplification since the NFET, either N34 or N23, in the branch charged to logic 1 is switched off, and this also reduces the current since one transistor is switched off in each branch.

An inverter 160 can be provided at node Z to further amplify the output signal. This inverter 160 can drive a higher capacitive load.

Figure 5:
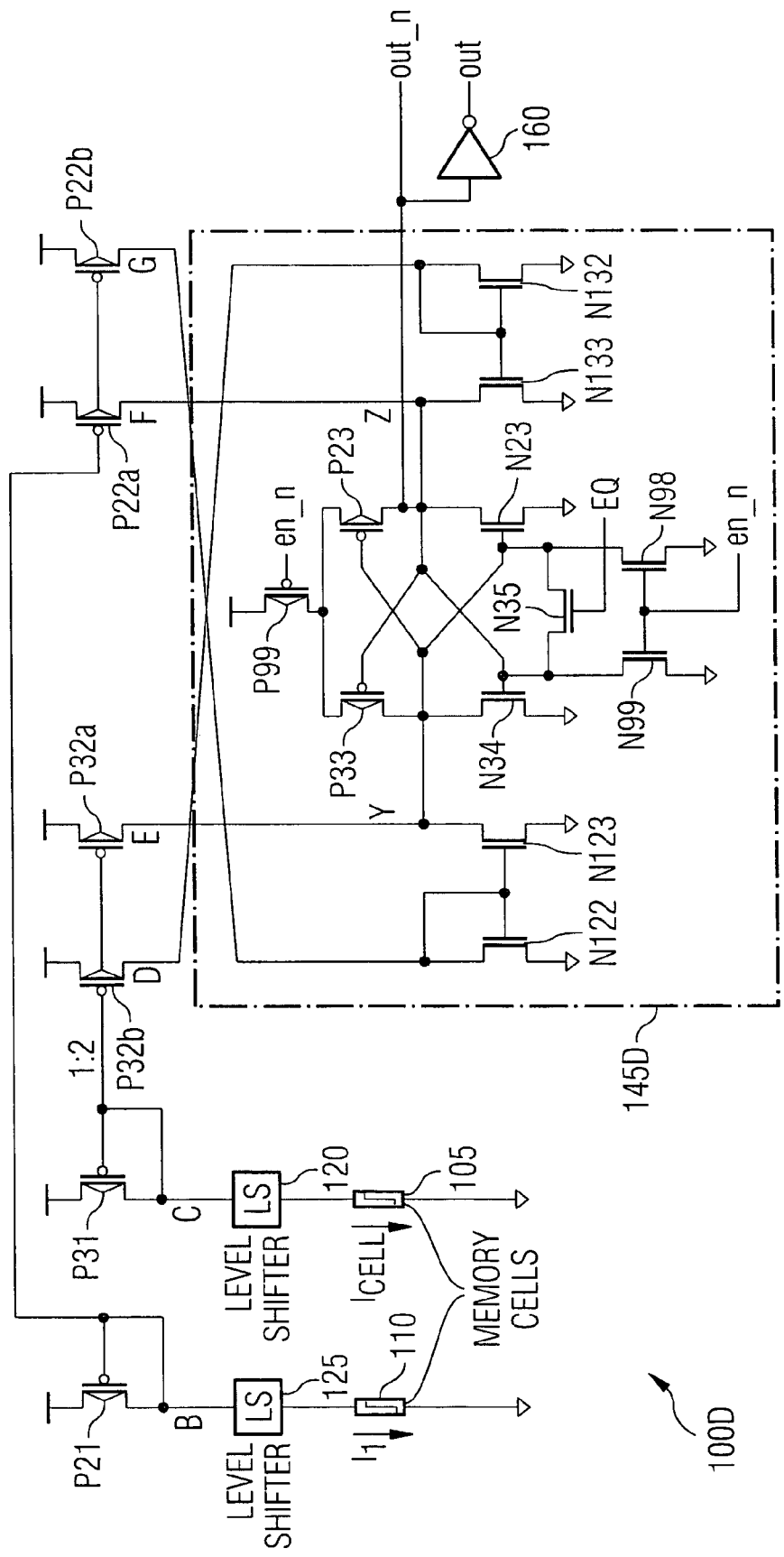
FIG. 5 is a schematic diagram of a circuit implementing a fourth embodiment of a read circuit.

FIG. 5 is a schematic diagram of a circuit 100D for determining the resistive state of the resistive memory cell 105. The circuit 100D implements a fourth exemplary embodiment of a read circuit 145D for reading the resistive memory cell 105. The read circuit 145D is constructed similarly to the read circuit 145C, but additionally has a subtraction circuit formed by N122 and N123 and a subtraction circuit formed by N133 and N132. Only one reference resistive memory cell 110 has been used in this example.

The current mirror formed by PFETs P21 and P22b mirrors the current $I_1$ flowing through the reference resistive memory cell 110 into branch G of the read circuit 145D. The current mirror formed by PFETs P21 and P22a mirrors the current $I_1$ flowing through the reference resistive memory cell 110 into branch F of the read circuit 145D. The current mirror formed by PFETs P31 and P32b has a mirror ratio of 1:2 and mirrors the current $I_{cell}$ flowing through the resistive memory cell 105 being read into branch D. The current mirror formed by PFETs P31 and P32a has a mirror ratio of 1:2 and mirrors the current $I_{cell}$ flowing through the resistive memory cell 105 being read into branch E.

A subtraction circuit is formed by NFETs N122 and N123, which mirror the current $I_1$ into branch E where the current $I_1$ is subtracted from the current $I_{cell}$. Another subtraction circuit is formed by NFETs N132 and N133, which mirror the current $I_{cell}$ into branch F where the current $I_{cell}$ is subtracted from the current $I_1$.

This cross-coupling causes the voltage difference between the nodes Y and Z of the read circuit 145D to become larger. One of the nodes Y, Z will be pulled close to the positive supply voltage, while the other one of the nodes Y, Z will be pulled close to ground. If $2*I_{cell} > I_1$, branch E (node Y) will be pulled up close to the positive supply voltage and branch F (node Z) will be pulled close to ground. If $I_1 > 2*I_{cell}$, branch F will be pulled up close to the positive supply voltage and branch E will be pulled close to ground. One advantage of this embodiment of the read circuit 145D is that the node pulled to ground is pulled down not only by the read circuit 145D, but also by the subtraction circuit formed by N122, N123 or N133, N132, even when the read circuit 145D is not yet switched on.

Transistor P99 and the input signal en_n are used to switch the read circuit 145D on and off. When the read circuit 145D is switched off, transistors N98 and N99 can be used to place each of the nodes Y and Z at a defined voltage value so that when the read circuit 145D is switched on, the read circuit 145D starts from the defined voltage value. The defined voltage value can be, for example, zero volts or a voltage halfway between logic 0 and logic 1. The signal EQ and the NFET N35 can be used to equalize nodes Y and Z. An inverter 160 can be provided at node Z to drive a higher capacitive load.

What is claimed is:

1. An integrated circuit comprising:
    a resistive memory cell;
    at least one reference resistive memory cell; and
    a read circuit having a first input coupled to the resistive memory cell and a second input coupled to the at least one reference resistive memory cell, the read circuit further including an output carrying an output signal based on a relationship between a reference current from the reference resistive memory cell and a current dependent on a resistive state of the memory cell.

2. The circuit according to claim 1, further comprising:
    a first current mirror coupled between the resistive memory cell and the first input of the read circuit; and
    a second current mirror coupled between the at least one reference resistive memory cell and the second input of the read circuit.

3. The circuit according to claim 2, further comprising:
    a first level shifter coupled between the resistive memory cell and the first input of the read circuit; and
    a second level shifter coupled between the at least one reference resistive memory cell and the second input of the read circuit.

4. The circuit according to claim 1, wherein the read circuit includes a current mirror that provides the output signal, the current mirror including a first branch fed with current dependent on the resistive state of the memory cell being read and a second branch fed with the reference current.

5. The circuit according to claim 1, wherein the read circuit comprises a plurality of cross-coupled-effect transistors.

6. The circuit according to claim 1, wherein the resistive memory cell comprises a programmable metallization cell or a phase change memory and wherein the at least one reference resistive memory cell comprises a programmable metallization cell or a phase change memory cell.

7. The circuit according to claim 1, wherein the read circuit includes:
    a subtraction circuit for subtracting the reference current from the current dependent on the resistive state of the memory cell; and
    a subtraction circuit for subtracting the current dependent on the resistive state of the memory cell from the reference current.

8. The circuit according to claim 1, wherein the read circuit comprises:
    a first NFET having a control terminal, a second NFET having a control terminal, a first PFET having a control terminal, and a second PFET having a control terminal;
    a first node connecting the first NFET, the first PFET, the control terminal of the second NFET, and the control terminal of the second PFET;
    a second node connecting the second NFET, the second PFET, the control terminal of the first NFET, and the control terminal of the second PFET;
    the first node being fed with the current dependent on the resistive state of the memory cell being read; and
    the second node being fed with the reference current.

* * * * *